(12) United States Patent
Rosenberg et al.

(10) Patent No.: US 6,586,678 B1
(45) Date of Patent: Jul. 1, 2003

(54) CERAMIC HEADER ASSEMBLY

(75) Inventors: Paul K. Rosenberg, Sunnyvale, CA (US); Giorgio Giaretta, Mountain View, CA (US); Stefano Schiaffino, Menlo Park, CA (US); Rudolf J. Hofmeister, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/077,067

(22) Filed: Feb. 14, 2002

(51) Int. Cl.[7] ............................................. H01L 23/02
(52) U.S. Cl. ...................................... 174/52.5; 174/52.1
(58) Field of Search .................................. 257/732, 733; 174/52.1, 52.5; 361/519, 537

(56) References Cited

U.S. PATENT DOCUMENTS

| | | | |
|---|---|---|---|
| 3,987,676 A | 10/1976 | Bennewitz | 73/336.5 |
| 4,128,697 A | 12/1978 | Simpson | 428/433 |
| 4,375,578 A | 3/1983 | Mitchell et al. | 174/52.5 |
| 4,769,684 A * | 9/1988 | Crocker et al. | 257/99 |
| 5,212,345 A * | 5/1993 | Gutierrez | 174/52.5 |
| 5,545,846 A * | 8/1996 | Williams et al. | 174/51 |

OTHER PUBLICATIONS

Setsuko Murata and Kazutoshi Mishimura Improvement in Thermal Properties of a Multi-Beam Laser Diode Array Aug., 1989.

* cited by examiner

*Primary Examiner*—Hung V. Ngo
(74) *Attorney, Agent, or Firm*—Workman, Nydegger & Seeley

(57) ABSTRACT

An improved transistor header assembly incorporating a rectangular platform perpendicularly bisecting the base of the transistor header. The ceramic platform provides the ability to house multiple electrical components and/or devices on either side of the base. The platform has a higher thermal conductivity than the base of a standard header. In addition, the platform increases the electrical input/output density of the header by increasing the number of potential electrical connections between the two sides of the base.

31 Claims, 3 Drawing Sheets

CERAMIC HEADER ASSEMBLY

THE FIELD OF THE INVENTION

This invention relates generally to the field of opto-electronic devices. In particular, embodiments of the present invention relate to a transistor header with a printed circuit board inserted perpendicularly through the cylindrical base. For example, embodiments of the present invention may find particular use in conjunction with lasers or optical receivers.

BACKGROUND AND RELATED ART

Transistor headers, or transistor outlines, (TOs) are extremely common in the field of opto-electronics. They essentially consist of a cylindrical metallic base with a number of conductive leads extending perpendicularly through both sides of the base. The leads are hermetically sealed to the base provide mechanical and environmental protection for the components contained in the TO package. In addition, the leads are sealed to the base in order to electrically isolate them from the metallic base. The ground lead is often electrically connected directly to the base. Various devices are typically mounted on the device side of the base of the header and connected to the leads. Some form of cap is commonly sealed over the device side of the base to prevent particles from damaging whatever device is mounted on the base. The type of cap and header typically depends on the application and the particular device being mounted on the base of the header. For example, if a semiconductor laser is mounted on the header, a cap would need to be at least partially transparent to allow the optical signal to be transmitted from the TO package. Compared to the shapes of other packages (e.g. the rectangular butterfly package), the cylindrical shape of a transistor header offers great advantages in terms of manufacturing costs and size sensitive adaptability.

Transistor headers are relatively inexpensive and they are manufactured in various configurations. The diameter of the base and the diameter of the leads are both variable. Standard transistor header diameter configurations are given specific numbers such as TO-5 or TO-46. These specific transistor header diameter configurations can still have different numbers of leads and can be equipped with many different caps.

Transistor headers are commonly used to protect and electrically attach sensitive electrical devices to printed circuit boards (PCBs). Specifically sized receptacles can be mounted on PCBs that electrically house a particularly sized header. In order to operate properly, environmentally sensitive devices, such as laser diodes, must be provided mechanical and environmental protection. By sealing the device in a chamber between the base of the header and the cap, the device is protected from mechanical and environmental damage, as well as contamination.

One of the general problems with standard headers is the limited number of potential leads or the small Input/Output (I/O) density. Certain complex devices require many isolated electrical connections to function efficiently. Standard headers are limited to the number of hermetically sealed leads that can be physically positioned on the base. Therefore, to increase the number of leads, the base must be made larger. In most applications, space is limited and it is undesirable to have a large header assembled within an electronic or opto-electronic subassembly.

Semiconductor devices often generate heat during operation and it is important to provide a means for removing thermal energy from the device in order to optimize performance. Standard headers are composed primarily of metallic materials (e.g. kovar) that are not particularly good thermal conductors. The high thermal resistance of most headers requires that special heat dissipation techniques be used to maintain the performance of a device that is mounted on the header. These heat dissipation techniques may require thermoelectric coolers (TECs), specialized thermal films, etc.

Semiconductor lasers operate efficiently if their driving impedance is precisely balanced with the impedance at the terminals. Impedance matching is often accomplished with additional electrical components such as resistors, capacitors and carefully designed transmission lines such as microstrips or striplines. The limited physical space available on standard headers often prevents additional components from being mounted directly on the base of the header and therefore the components must be mounted on the actual printed circuit board. Device performance is compromised due to limitations in the ability to place these components sufficiently close to active devices such as lasers or ICs. The limited number of conductive leads on standard headers further limits the number of additional components that can be used to match the driving impedance with the terminal impedance. Finally, it is relatively difficult to precisely control the electrical impedance of the glass/metal feedthru due to 1, limited choices of the lead diameter; 2) limited choices of the dielectric value of the sealing glass; and 3) difficulty in controlling the position of the lead with respect to the thru hole in the header base.

Therefore, there is a need for a header that increases the I/O density of the standard header without increasing the relative diameter of the header. In addition, the header should provide a larger area to mount additional devices without increasing the overall diameter. The improved header should selectively incorporate higher thermal conductivity paths such that heat generation within the package can be managed more effectively. Such a header would have all of the features of a standard header with the additional advantages mentioned above.

BRIEF SUMMARY OF THE INVENTION

These and other problems in the prior art are addressed by embodiments of the present invention, which relates to an improved header assembly that is equipped with an additional platform extending perpendicularly through the base of the header.

In an exemplary embodiment, the header assembly includes a substantially cylindrical metallic base and a platform extending perpendicularly through and out from either side of the base. The platform is constructed from an insulating material such as a ceramic. The platform is hermetically sealed to the base so as to provide mechanical and environmental protection for the components contained in the TO package. A flat surface formed by the platform on either side of the base is capable of receiving multiple electrical components. The platform includes at least one conductive pathway that extends throughout the platform and consequently through the base. The conductive pathway(s) are capable of conducting isolated electrical signals from one side of the base to the other in substantially the same manner as the leads found on standard headers.

The header assembly includes a ceramic platform that provides several preferred functions. In particular, the ceramic platform can be fabricated with multiple layers and finely defined electrical traces, thus allowing it to house multiple electrical components on either side of the base. In addition, the ceramic platform can be fabricated with materials such as aluminum nitride and beryllia, which have higher thermal conductivity than the base of a standard header. The ceramic platform also increases the electrical input/output density of the header by increasing the number of potential electrical connections between the two sides of the base. For instance, many prior art transistor header assemblies have only four leads, whereas the transistor header assemblies of the invention can have significantly more electrical connections as desired.

A semiconductor laser is one example of the devices that can be mounted on the platform of the header assembly. To operate efficiently, the laser's driving impedance must be matched with the component impedance. Additional components are mounted on top of the platform and on either side of the base to properly match the impedances. The platform is formed from a ceramic, thereby increasing the thermal conductivity of the header. In addition, a photodiode is mounted directly either in a recessed pocket of the platform or on the side of the base containing the semiconductor laser. The photodiode is used for feedback purposes.

An optical receiver is another example of a device that can be mounted on the platform of the header assembly. An optical receiver can be a photodetector or any other device capable of detecting optical signals. Optical receivers may also require additional electrical components to be mounted on the platform. In addition, optical receivers can be configured to detect optical signals in a vertical orientation or a horizontal orientation. Therefore, an optical receiver can be mounted in either of these orientations on the platform of the header assembly.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered as limiting its scope, the invention will be described and explained with additional specificity and detail through the use of the accompanying drawings in which.

DETAILED DESCRIPTION OF THE PREFERRED EMBODIMENTS

Reference will now be made to the drawings to describe the presently preferred embodiments of the invention. It is to be understood that the drawings are diagrammatic and schematic representations of the presently preferred embodiments, and are not limiting of the present invention, nor are they necessarily drawn to scale.

In general, the present invention relates to an improved header assembly that incorporates a platform extending perpendicularly through the substantially cylindrical base portion of the header assembly. Moreover, multiple conductive pathways extend through the platform and consequently through the base. Flat surfaces capable of housing electrical components are formed by the platform on either side of the base. Also, while embodiments of the present invention are described in the context of electro-optics, it will be appreciated that the teachings of the present invention are applicable to other applications as well. For example, other types of electrical devices could utilize the increased electrical input/output density and thermal conductivity of the header assembly.

Figure 1A:
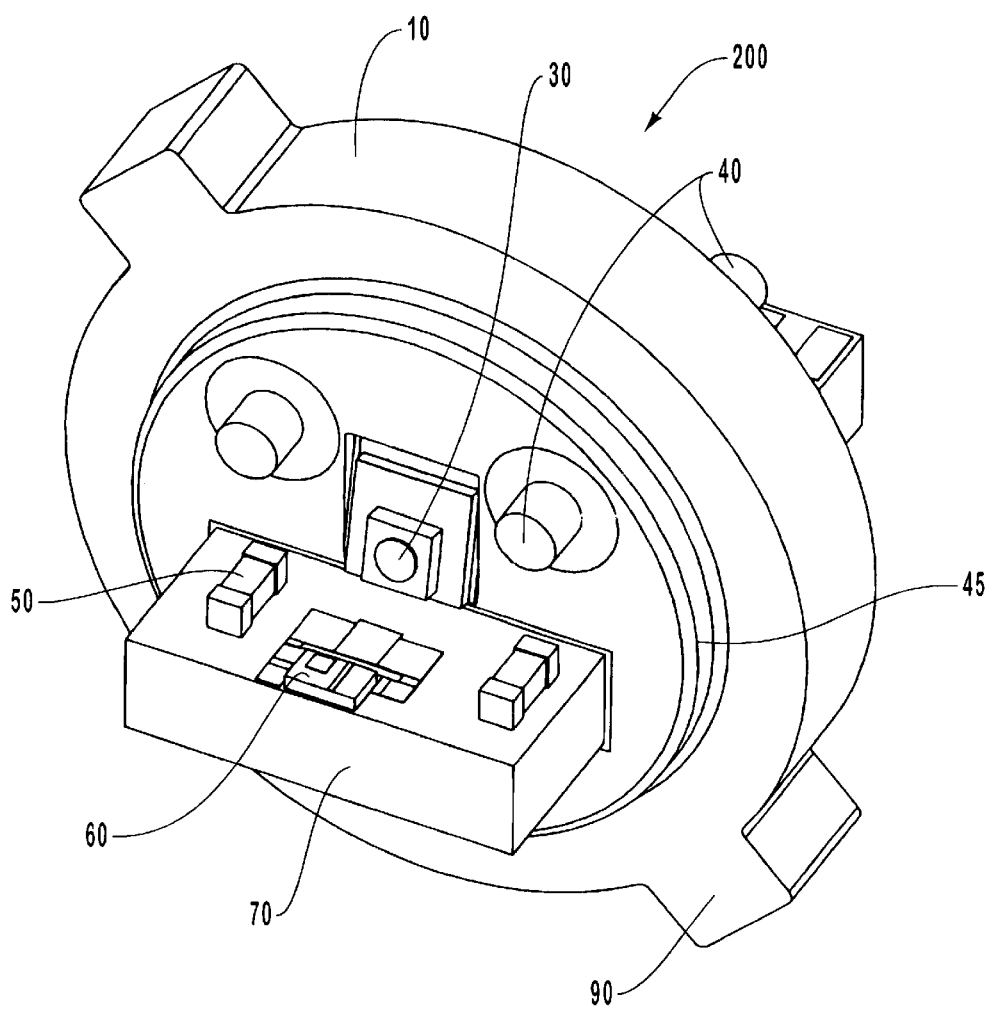
FIG. 1A illustrates a perspective view of one presently preferred embodiment of a header assembly.
Figure 1B:
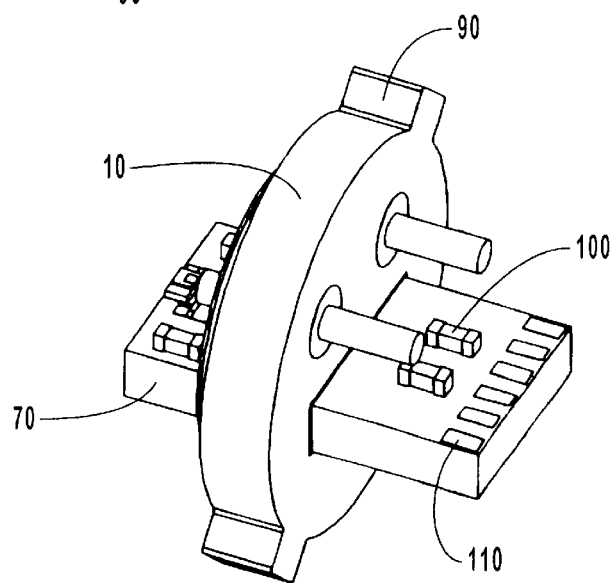
FIG. 1B illustrates a different perspective view of one presently preferred embodiment of a header assembly.

Reference is first made to FIGS. 1A and 1B together, which illustrate perspective views of one presently preferred embodiment of a header assembly, designated generally at 200. In the illustrated example, the header assembly 200 includes a substantially cylindrical metallic base 10. The base 10 contains two flanges 90 for releasably securing the header 200 to a receptacle (not shown) on a higher level opto-mechanical assembly. The base can be formed of Alloy 42, which is an iron nickel alloy, as well as cold rolled steel, or Vacon VCF-25 Alloy. The base 10 also includes a ceramic platform 70 extending perpendicularly through the base as shown. The ceramic platform is hermetically sealed to the base to provide mechanical and environmental protection for the components contained in the TO package.

The hermetic seal between the base 10 and the platform 70 is created by electrically insulating glass-to-metal seals that are known in the art. Alternatively, the platform 70 may incorporate two additional ceramic outer layers to electrically isolate the outermost conductors. In this second case a metal braze or solder can be used to hermetically seal the platform 70 to the metal base. This solution overcomes the principal shortcomings of glasses, namely their low strength, brittleness, and low thermal conductivity. The platform 70 is structured to house multiple electrical components 50, 100 and devices 60 on either side of the base. In the illustrated embodiment, the device 60 is a semiconductor laser 60 and the additional components 50, 100 are resistors, capacitors, and inductors that are used to balance the laser's driving impedance with the component impedance. It is important for the semiconductor laser 60 to be precisely positioned perpendicularly to the base 10 and therefore the platform 70 is precisely positioned perpendicularly to the base 10. A small deviation in the semiconductor laser's 60 position in relation to the base 10 can cause a large deviation in the direction of the laser beam. Accurate perpendicularity between the platform and the base can be achieved by incorporating a vertical pedestal feature in the base material as shown on FIG. 1A. The vertical pedestal houses the photodiode 30 in the embodiment shown in FIG. 1A. Such feature can be machined, stamped, or metal injection molded directly with the base thus providing a stable and geometrically accurate surface for mating with the platform.

The platform 70 further includes multiple electrically isolated conductive pathways 110 extending throughout the platform 70 and consequently through the base 10. The conductive pathways 110 provide the electrical connections necessary between electrical devices or components located throughout the platform 70. The conductive pathways 110 form a connector on the side of the base that does not contain the semiconductor laser 60. This connector is used to electrically connect the header assembly 200 to a second electrical subassembly, such as a printed circuit board, either directly (for example, by solder connection) or indirectly by an intermediary device such as a flexible printed circuit. The semiconductor laser 60 is electrically connected to the electrical components 50, 100 via the conductive pathways 110. In one embodiment, the platform 70 is itself a printed circuit board having conductive pathways 110 formed therein.

The use of advanced ceramic materials—such as aluminum nitride and beryllia—allows the header assembly to achieve substantially lower thermal resistances between the devices inside the package and the outside world where heat is ultimately transferred. A cooling device—such as a thermoelectric cooler, a heat pipe or a metal heat spreader—can be mounted directly on the platform thus maintaining a very short thermal path between the temperature sensitive devices on the platform and a heat sink located outside the header assembly.

As is further shown in FIGS. 1A and 1B, the header assembly 200 further includes two conductive leads 40 extending through and out both sides of the base 10. The conductive leads 40 are hermetically sealed to the base 10 to provide mechanical and environmental protection for the components contained in the TO package between the conductive leads 40 and the base 10. The hermetic seal between the conductive leads 40 and the base 10 is created, for example, by glass or other comparable hermetic insulating materials that are known in the art. The conductive leads 40 can also be used to electrically connect devices and/or components located on opposite sides of the base. The conductive leads 40 extend out from the side of the base 10 that does not contain the semiconductor laser 60 in a manner that allows for the electrical connection with a specific header receptacle located on a printed circuit board. It is important to note that conductive pathways 110 and conductive leads 40 perform the same function and that the number of potential conductive pathways 110 is far greater than the potential number of conductive leads 40. Therefore, alternative embodiments can incorporate even more conductive pathways 110 than shown in the illustrated embodiment.

The platform 70 further includes steps and recessed areas that permit mounting devices with various thicknesses flush with the metal pads on the ceramic. This allows the use of the shortest electrical interconnects—such as wire bonds—with improved electrical performances.

The photodiode 30 is used to detect the signal strength of the semiconductor laser 60 and relay this information back to control circuitry (not shown) of the semiconductor laser 60. In the illustrated embodiment, the photodiode can be directly connected to the conductive leads 40. Alternatively, the photodiode can be mounted directly onto the same platform as the laser, in a recessed position with respect to the light emitting area. The recessed position allows the photodiode to capture a fraction of the light emitted by the laser, thus allowing it to perform the same monitoring function. This configuration of the monitoring photodiode allows for eliminating the need of conductive leads 40, and lends itself to simplified electrical connections—such as wire bonds—to the conductive pathways 110 of the platform 70. In an alternative embodiment, the photodiode light gathering can be increased by positioning an optical element on the base for focusing or redirecting light, such as a mirror, or by directly shaping and/or coating the base metal to focus additional light onto the photodiode.

As is further shown in FIGS. 1A, the base 10 further includes a protruding portion 45 that is configured to releasably position or locate a cap (not shown) over one side of the base 10. A cap can be placed over the side of the base 10 containing the semiconductor laser 60 for the purpose of protecting the semiconductor laser 60 from potentially destructive particles. A transparent cap is preferable for the illustrated embodiment so as to allow the laser light to escape the region between the cap and the base 10.

Figure 2A:
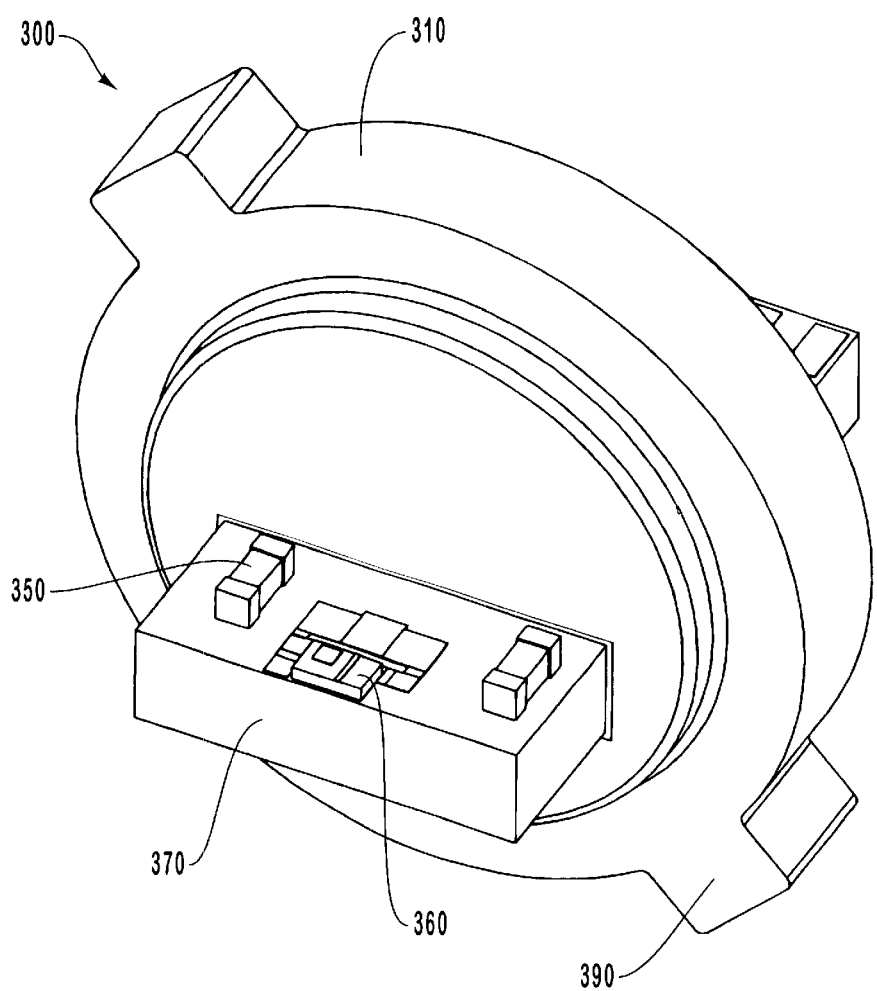
FIG. 2A illustrates a perspective view of an alternative embodiment of a header assembly.
Figure 2B:
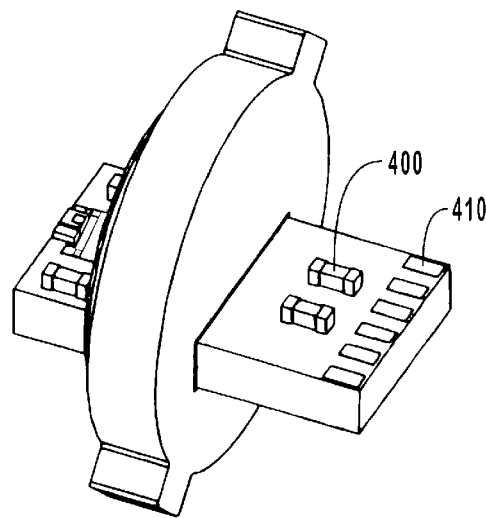
FIG. 2B illustrates a different perspective view of an alternative embodiment of a header assembly.

Reference is next made to FIGS. 2A and 2B, which illustrate perspective views of an alternative embodiment of a header assembly, designated generally at 300. This alternative embodiment shows an optical receiver 360 mounted horizontally on the platform 370 perpendicularly bisecting the base 310 of the header assembly 300. The optical receiver can be a photodetector or any other device capable of receiving optical signals. The optical receiver 360 is mounted flat on the platform 370 and detects light signals through the side facing away from the base 310. This type of optical receiver is known as an edge detecting detector. The base 310 and platform 370 are described in more detail with reference to FIGS. 1A and 1B. The platform 370 contains electrical components 350, 400 on either side of the base for operating the optical receiver 360. The platform 370 also includes conductive pathways 410 for electrically connecting devices or components on either side of the base 310. This embodiment of a header assembly does not contain conductive leads and therefore all electrical connections are made via the conductive pathways 410.

Figure 3A:
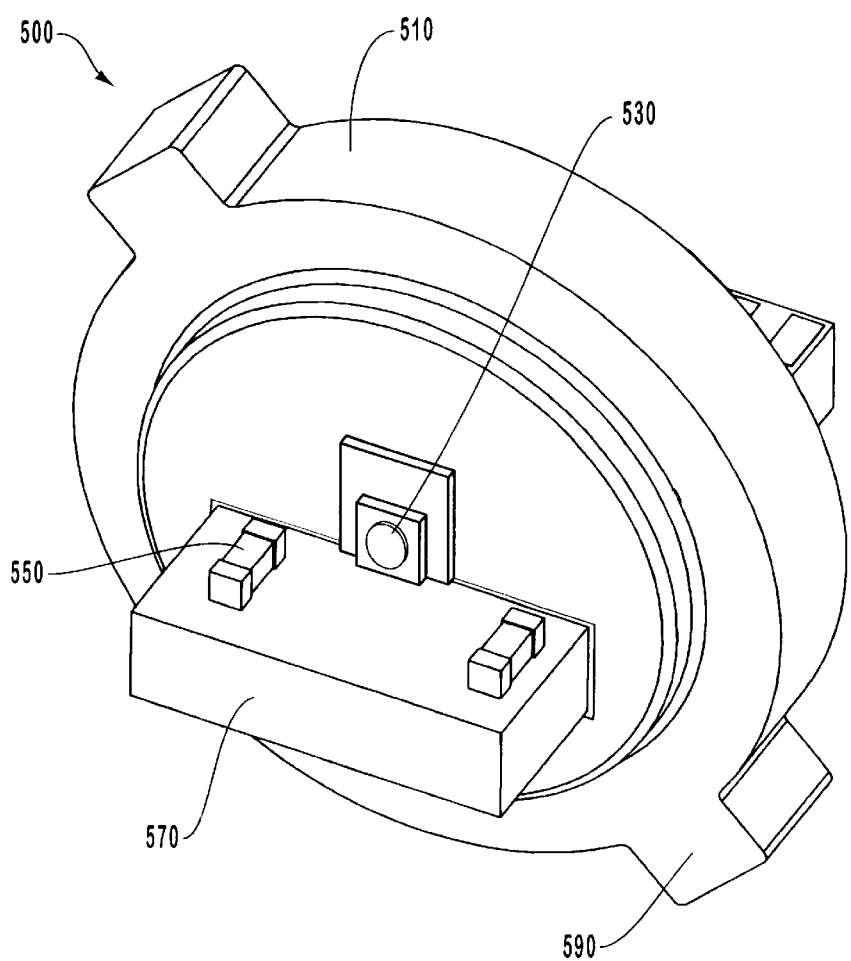
FIG. 3A illustrates a perspective view of yet another alternative embodiment of a header assembly.
Figure 3B:
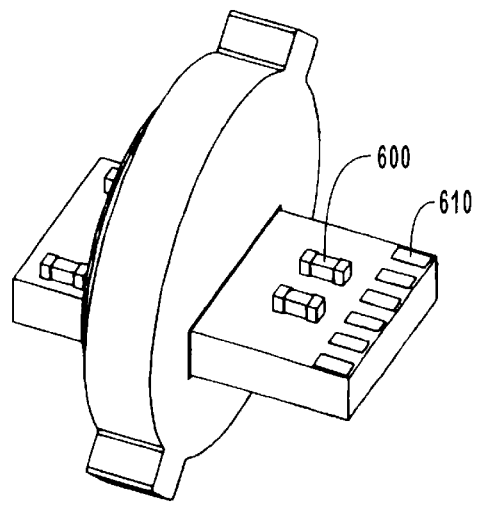
FIG. 3B illustrates a different perspective view of yet another alternative embodiment of a header assembly.

Reference is next made to FIGS. 3A and 3B, which illustrate perspective views of yet another alternative embodiment of a header assembly, designated generally at 500. This alternative embodiment also shows an optical receiver 530 mounted vertically on the base 510. The optical receiver can be a photodetector or any other device capable of receiving optical signals. This is an optical receiver 530 which detects light signals from the top of the device. The base 510 and platform 570 are described in more detail with reference to FIGS. 1A and 1B. The platform 570 contains electrical components 550, 600 on either side of the base for operating the optical receiver 530. The platform 570 also includes conductive pathways 510 for electrically connecting devices or components on either side of the base 510. This embodiment of a header assembly does not contain conductive leads and therefore all electrical connections are made via the conductive pathways 410.

To summarize, embodiments of the present invention provide a number of advantages over traditional transistor header assembly designs. The disclosed header assembly incorporates a novel platform extending perpendicularly from the base of the header assembly. This platform can be used to incorporate numerous conductive pathways and house numerous electrical components and/or devices. Moreover, the header assembly has improved thermal conductivity properties over traditional headers due to the insulating composition of the platform. Also, the header assembly is designed to incorporate all of the size and adaptability advantages of standard headers.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A transistor header assembly for housing an electrical component comprising:
   a base formed from a metallic material, wherein the base has a device side and a component side; and
   a platform extending perpendicularly through both the device side and the component side of the base, wherein the platform further includes at least one conductive pathway extending substantially through the platform.

2. A transistor header assembly as defined in claim 1, wherein the transistor header assembly further comprises at least one lead extending through the device side and the component side of the base, wherein the at least one lead is hermetically sealed to the base.

3. A transistor header assembly as defined in claim 1, wherein the base further comprises means for orienting and locking the header into a receptacle.

4. A transistor header assembly as defined in claim 1, wherein the base further comprises means for receiving a cap over the device side.

5. A transistor header assembly as defined in claim 1, wherein the transistor header assembly further comprises a cap sealed over the device side of the base.

6. A transistor header assembly as defined in claim 1, wherein the platform includes an insulating material.

7. A transistor header assembly as defined in claim 6, wherein the insulating material is a ceramic.

8. A transistor header assembly as defined in claim 1, further comprising a laser mounted on the platform.

9. A transistor header assembly as defined in claim 8, further comprising a photodetector for monitoring the laser.

10. A transistor header assembly as defined in claim 1, wherein the base has a substantially cylindrical shape.

11. A transistor header assembly as defined in claim 1, wherein the platform further includes a metal pedestal fabricated directly with the metal base in order to provide an accurate mounting surface for the devices at a perpendicular angle with the base.

12. A transistor header assembly as defined in claim 1, wherein the platform further includes electrical components which match the impedance between device side and the component side of the base.

13. A transistor header assembly as defined in claim 1, wherein the platform further includes multi-level steps to allow mounting of devices flush with the base and therefore minimizing the length of electrical interconnects such as wire bonds.

14. A transistor header assembly as defined in claim 1, wherein the platform further includes two additional insulating layers in the region where the platform passes through the base to allow for a hermetic metal seal.

15. A transistor header assembly as defined in claim 1, wherein the platform further includes a monitor photodiode mounted directly onto the base.

16. A transistor header assembly as defined in claim 1, wherein the platform further includes a monitor photodiode mounted directly onto the platform in a recessed position with respect to a light emitting area generated by a light source.

17. A transistor header assembly as defined in claim 15, wherein the platform further includes an optical element, for focusing or redirecting light, mounted directly onto the base to increase the light gathering of the monitor photodiode.

18. A transistor header assembly as defined in claim 1, wherein the platform further includes a cooling device directly attached to an outside portion of the platform.

19. A transistor header assembly comprising:
    a base having a device side and a component side;
    means for housing an electrical component on a surface extending substantially perpendicular from both the device side and the component side of the base; and
    means for electrically connecting the device side of the base to the component side of the base.

20. A transistor header assembly as defined in claim 19, wherein the header assembly further comprises means for providing efficient transfer of thermal energy from the electrical components on the surface to a thermal reservoir outside of the header.

21. A transistor header assembly as defined in claim 19, wherein the base further comprises means for locking the header into a receptacle.

22. A transistor header assembly as defined in claim 19, wherein the base further comprises means for receiving a cap over the device side.

23. A transistor header assembly as defined in claim 19, wherein the means for housing comprise a platform formed primarily of a ceramic material.

24. A transistor header assembly as defined in claim 23, wherein the platform comprises a printed circuit board.

25. A transistor header assembly as defined in claim 24, wherein means for electrically connecting comprise electrically conductive pathways formed in the printed circuit board.

26. A transistor header assembly as defined in claim 19, further comprising a laser mounted on the means for housing, wherein the laser is the electrical component.

27. A method for mounting an electrical component on a printed circuit board, comprising the acts of:
    providing a transistor header assembly including:
      a base formed from a metallic material, wherein the base has a device side and a component side; and
      a platform extending perpendicularly through both the device side and the component side of the base, wherein the platform further includes at least one conductive pathway extending substantially through the platform;
    providing an electrical component mounted on the device side of the platform, such that the electrical component is electrically connected to the at least one conductive pathway; and
    mounting the transistor header assembly to the printed circuit board.

28. A method as defined in claim 27, wherein the electrical device comprises a laser.

29. A method as defined in claim 28, further comprising the act of providing a photodetector mounted to the transistor header assembly for monitoring the laser.

30. A method as defined in claim 27, wherein the platform is formed from a ceramic material.

31. A method as defined in claim 27, wherein the platform comprises a printed circuit board, separate from the printed circuit board on which the transistor header assembly is mounted.

* * * * *